Feb. 23, 1954 L. M. MINSK ET AL 2,670,287
PHOTOSENSITIZATION OF POLYMERIC CINNAMIC ACID ESTERS
Filed Jan. 20, 1951
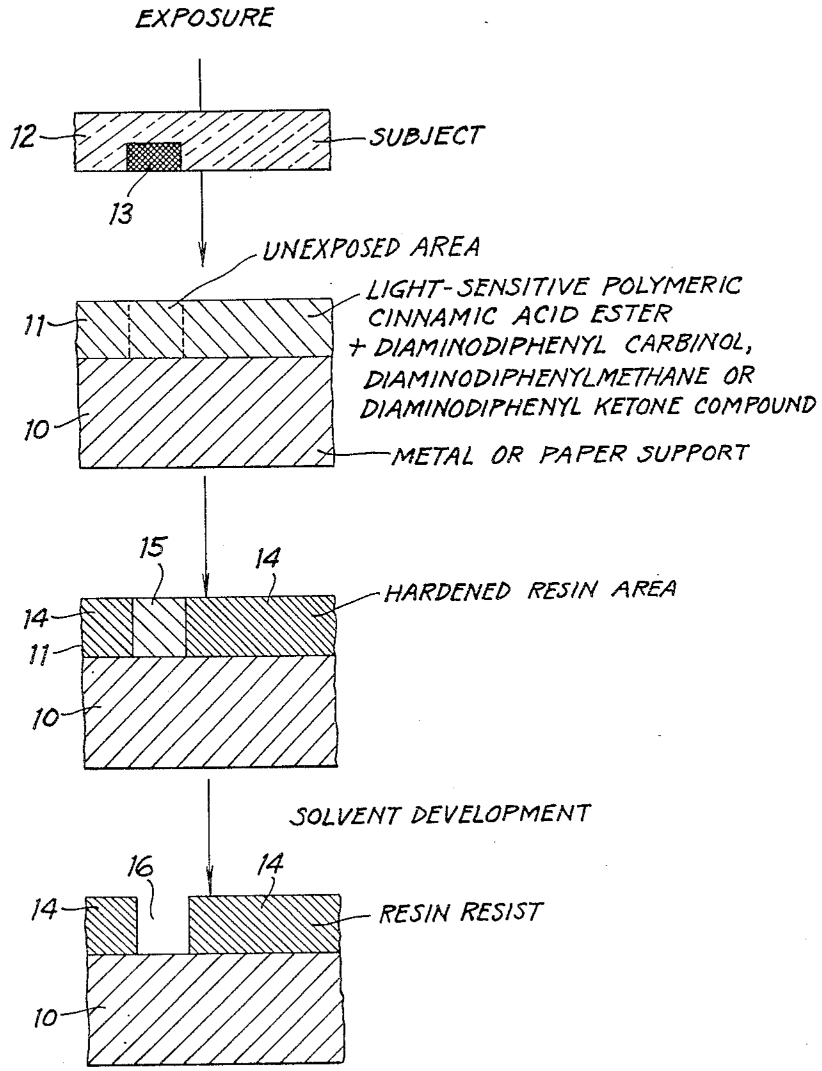
LOUIS M. MINSK
WERTER P. VAN DEUSEN
EARL M. ROBERTSON
INVENTORS
Daniel I. Mayne
BY W. H. McDowell
ATTORNEY & AGENT Patented Feb. 23, 1954 2,670,287

UNITED STATES PATENT OFFICE 2,670,287

PHOTOSENSITIZATION OF POLYMERIC CINNAMIC ACID ESTERS

Louis M. Minsk, Werter P. Van Deusen, and Earl M. Robertson, Rochester, N. Y., assignors to Eastman Kodak Company, Rochester, N. Y., a corporation of New Jersey Application January 20, 1951, Serial No. 207,051

17 Claims. (Cl. 95—7)

This invention relates to the photosensitization of cinnamic acid esters of polymeric materials and more particularly to the photosensitization of cinnamic acid esters of polyvinyl alcohol and cellulose.

It is well known in the art of photomechanical reproduction to utilize various materials such as bichromated shellac, albumin or polyvinyl alcohol for forming resist images upon various supports, such as metal plates. The support is then etched or otherwise treated in the areas not covered by the resist image and the resultant plate, usually after removal of the resist image, is used for printing. One method of forming relief images on metal supports is disclosed in the Murray U. S. Patent 1,965,710, granted July 10, 1934, and includes using as a sensitive layer for forming a resist image, a layer of cinnamal ketone containing another resinous material which, after exposure under a design, may be selectively dissolved in the unexposed area whereby the area of the support thus bared may be etched.

We have discovered certain polymeric materials which are light-sensitive and which have properties superior to the mentioned dichromated materials or cinnamal ketone. Furthermore, we have discovered that these polymeric materials can be sensitized to increase their sensitivity to actinic rays as much as a hundred times. Therefore, one object of our invention is to provide the superior light-sensitive materials of particular use in making resists for printing plates. A further object is to provide sensitizer compounds capable of increasing the light-sensitivity of the polymeric materials. Another object is to describe the preferred applications for the sensitized materials. Other objects will become apparent from the following description of our invention.

The objects of our invention are accomplished in part by utilizing a polymeric material containing cinnamoyl groups such as a cinnamic acid ester of polyvinyl alcohol or cellulose, preferably the former, as a combined carrier and light-sensitive material, and diphenyl carbinol, diphenyl methane and benzophenone compounds as sensitizers for the cinnamic acid ester. Other objects are accomplished by utiliizng the sensitive resist compositions for making resist images for printing plates. Suitable light-sensitive cinnamic acid esters are, for example, cinnamic acid esters of starch, polyvinyl alcohol and cellulose as well as of partially alkylated cellulose or polyvinyl alcohol, either completely or partially hydroxy-alkylated cellulose or polyvinyl alcohol, and partially esterified cellulose or polyvinyl alcohol. Other polymeric materials containing cinnamoyl groups, which are useful in our invention, are disclosed in the Allen et al. U. S. patent application Serial No. 771,142, filed August 28, 1947, now U. S. Patent No. 2,566,302, granted September 4, 1951, e. g., cinnamoylated polystyrene resins.

The sensitized polymeric materials are exposed in the usual manner to line or halftone subjects and after exposure are treated with a solvent to remove the coating only in the unexposed area of the plate and an intermediate plate is thus obtained provided with a resinous resist image useful in a variety of processes to form final printing plates.

In the accompanying drawings, the various figures show in enlarged cross-sectional view the structure of a representative sensitive element of our invention at various stages in the process of producing intermediate printing plates having selected areas covered by a polymeric resist image.

The preferred light-sensitive polymeric materials of the invention are obtained by esterification of hydroxy-containing polymeric materials such as cellulose or polyvinyl alcohol with a cinnamic acid halide such as cinnamic acid, o-chloro, or m-nitro cinnamic acid chlorides as described in our copending application, relating to quinone sensitizing compounds, Serial No. 207,050, filed concurrently. Cinnamic acid esters of varying acyl content may be prepared by deacylation of substantially fully esterified cinnamic acid esters as described in the mentioned application. Accordingly, we use the solvent-soluble esters containing from about 60 to 100 mol per cent, preferably about 87 to 100 mol per cent, of vinyl cinnamate.

By the term "polyvinyl cinnamate" we mean to include only organic solvent-soluble esters of polyvinyl alcohol containing from about 60 to 100 mol per cent of combined vinyl cinnamate groups, the balance being vinyl alcohol groups. Polyvinyl cinnamate of the insoluble type obtained by polymerization of vinyl cinnamate is not contemplated for use in our invention.

By the term "cinnamic acid esters of polyvinyl alcohol and cellulose" we mean organic solvent-soluble esters containing from about 60 to 100 mol per cent of combined cinnamyl ester groups. This includes simple as well as mixed esters, e. g. polyvinyl acetate cinnamates and cellulose acetate cinnamates, containing at least 60 mol per cent cinnamoyl ester and the balance comprising a different acyl group or being unesterified or both.

A typical resist lacquer useful for forming resist images on printing plates is compounded of the following materials:

| | | |
|---|---|---|
| Polyvinyl cinnamate | grams | 2.5 |
| Methyl glycol acetate | cc | 100 |
| Sensitizer compound | gram | 0.25 |

When using a polymeric m-nitrocinnamic acid ester, such as polyvinyl m-nitrocinnamate, we prefer to disperse the resin together with the sensitizer in nitrobenzene. The coatings made from this solution are preferably developed with nitrobenzene at a temperature of about 110° F. for about one minute. When using the cellulose cinnamate, it is preferable to disperse the ester in 1,4-dioxane for coating, and develop the resist image in 1,4-dioxane.

Solvents and solvent combinations for the coating compositions and for developing the exposed sensitive layers of the invention can be selected from those set forth in the mentioned patent application.

The concentration of sensitizer compound in the coating formula depends somewhat upon the solubility in the particular solvent used, the compatibility of the sensitizer with the sensitive polymeric material and of course the amount of polymeric material present. In the case of polyvinyl cinnamate, from about 2 to 25 per cent, preferably 10 per cent, by weight of sensitizing compound based on the weight of polyvinyl cinnamate gives useful results. With certain sensitizers, an amount less than 2 per cent produces measurable speed increases. The concentration of polyvinyl cinnamate in the coating formula can be varied as required by the particular conditions of coating under consideration, about 2.5 per cent resin being useful for grained metal or paper plates and about 7.5 per cent for polished metal such as copper, zinc and magnesium.

Examples of diphenyl carbinol, diphenyl methane and benzophenone compounds suitable as sensitizers for the polymeric materials such as the cinnamic acid esters, especially polyvinyl cinnamate, are tabulated in the following table, the numerical value opposite each compound indicating the relative speed obtained when using polyvinyl cinnamate as the sensitive polymeric material. The coatings from which the speed evaluations were obtained were made from solutions of one part of chlorobenzene and three parts of toluene by volume containing per 100 grams solvent, 2.5 grams of polyvinyl cinnamate and 0.25 gram of the sensitizing compound. A speed value of 2 represents the initial speed of the polyvinyl cinnamate. For comparison purposes on the same scale, a dichromate-sensitized shellac coating would have a speed value of approximately 30.

| | |
|---|---|
| 4,4'-tetramethyldiaminodiphenyl ketone | 650 |
| 4,4'-tetramethyldiamino benzophenone oxime | 9 |
| 4,4'-tetramethyldiamino diphenylmethane | 45 |
| 4,4'-tetramethyldiamino diphenylcarbinol | 100 |
| 4,4'-tetramethyldiamino benzophenone imide | 100 |
| 4,4'-tetramethyldiamino thiobenzophenone | 13 |
| 4,4'-diaminodiphenyl ketone | 35 |
| 2,4-dichlorodiphenyl ketone | 16 |
| Diphenyl ketone | 20 |
| 4,4'-diamino-3,3'-di-o-tolylmethane | 208 |
| Dibenzalacetone | 60 |
| Benzil | 50 |
| Trans-dibenzoylethylene | 20 |
| 4,4'-tetraethyldiaminodiphenyl ketone | 740 |

Ketones, such as benzoylacetone, acetophenone and diphenyl-methyl ketone, and aldehydes, such as benzaldehyde, 2,6-dichlorobenzaldehyde and salicylaldehyde, in general, are less effective as sensitizers than the tabulated diaryl compounds. However, 9-anthraldehyde imparted a speed of 40 to polyvinyl cinnamate.

The compounds contemplated by our invention for use as sensitizing agents for the polymeric materials represented in the above tabulation have the following general formula:

wherein R and R¹ each represent aryl groups of the benzene series, substituted or not, with alkyl, alkylamino, amino, halogen groups etc., the alkyl groups containing preferably from 1–4 carbon atoms e. g. methyl, ethyl, isopropyl, X and Y each represent hydrogen groups, as in the diarylmethane compounds, or X represents a hydrogen atom when Y is a hydroxyl group, as in the hydrol forms of the diaryl ketones, and X and Y together represent either O, NOH, NH or S groups connected by a double bond to the central carbon atom.

The diaminodiphenyl ketone compounds are particularly efficacious as sensitizers for the polymeric materials as shown by the speed value of 650 imparted by tetramethyldiaminodiphenyl ketone. Nuclear substitution products of this, and the other diaminodiphenyl ketones, also impart appreciable sensitivity to the polymeric cinnamoylated compounds. The hydrols of such ketones are also important. The diphenyl methane, the imado and thio-benzophenone compounds, are representative of well known dyes and dye intermediates useful in our invention. The acid salts of the sensitizing agents mentioned comprise a part of our invention; however, we select the form of sensitizing agent most soluble in the solvent system in use and for imparting the greatest speed to the polymeric material.

By the term "resist composition" as used herein and in the appended claims, we mean a system containing as its essential ingredients one of the polymeric materials and one of the sensitizing agents of the invention, either as a solid mixture of chemicals, for example, as in a coating on a support, or as a mixture of chemicals in organic solvent solution.

Our invention will be understood by consideration of the accompanying drawings and the following examples illustrating various means of employing the light-sensitive polymeric materials for forming resist images and printing plates therefrom.

*Example*

A cinnamic acid ester such as polyvinyl cinnamate (2.5 grams), the preparation of which is described above, was dissolved in 100 cc. of methyl glycol acetate and 0.25 gram of 4,4'-tetramethyldiaminodiphenyl ketone was then dissolved in the resinous dope. The order of mixing the components is not especially critical. The resist composition in liquid form was then poured onto a lithographic paper printing plate support, such as a paper sheet carrying a layer of material which is repellent to greasy printing inks when wet and the coated plate was whirled at approximately 50 to 100 R. P. M. until the coating was dry. The operation is preferably carried out in subdued light. The sensitized plate appears as shown in enlarged cross-sectional view in the first stage of the drawings wherein layer 10 represents the paper support and layer 11 the polyvinyl cinnamate sensitized with the ketone compound. The plate was then exposed under a line or halftone image at 4 feet from a 35-ampere white flame carbon arc for about one minute, as shown in the first stage of the drawings wherein the subject is represented by a transparent layer 12 containing an image 13 opaque to light. The result of exposure is to insolubilize the layer in the exposed region 14 of layer 11 leaving unaffected material in the unexposed area 15 as shown in the drawings. After exposure, development was carried out for two minutes in a tray of methyl ethyl ketone. The result was that the unexposed area 15 of the plate was readily dissolved, leaving a resin resist 14 on the support 10 and in the unexposed areas 16 from which the resin and sensitizer had been removed, the ink-repellent area of the support was revealed. If desired, the resist can now be dyed, with a suitable dye to increase its visibility, dye being selected which does not stain the non-printing areas 16. At this stage, the plate can be used as a lithographic printing plate or further processed, depending upon the particular support which has been used or the photomechanical process under consideration. Thus, when applying the above procedure to making etched zinc halftone images, the above type of coating was coated on a degreased photoengraving zinc plate, dried, exposed, developed and etched for four minutes with 10 per cent nitric acid solution, to which a wetting agent may be added, to obtain a relief plate. The plate was then rubbed to remove the resist, the removal being aided, if desired, by use of a solvent such as benzene or acetone.

The resist compositions of the invention can be utilized for producing bi-metallic plates, etched copper halftones, cellulose ester printing plates, grained zinc and aluminum lithographic plates, zincated lithographic plates, etc., as described in the hereinafter mentioned copending application.

In the manner of the above example, any of the mentioned sensitizers can be incorporated into a solvent system containing a polymeric cinnamic acid ester, especially polyvinyl cinnamate, and the resultant composition used for making a printing plate.

It will be apparent from the above description that the preferred process of our invention broadly contemplated includes the steps of exposing a layer of a cinnamic acid ester of polyvinyl alcohol containing as a sensitizer a diphenyl ketone compound activating the ester in the presence of actinic rays to render the ester insoluble and then dissolving only the unexposed area of the layer with an organic solvent leaving the ester on the support in relief form in only the exposed area.

The preferred light-sensitive coatings of our invention broadly contemplated include light-sensitive coatings comprising a cinnamic acid ester of polyvinyl alcohol and as a sensitizer a di-phenyl ketone compound activating the ester in the presence of actinic rays to render it insoluble in an organic solvent.

The mechanism of the activation is not fully understood. However, it does enable the insolubility to be obtained with shorter exposures to light than is the case with the polymeric materials not especially sensitized.

As indicated above, the type of printing plate obtained depends somewhat upon the support used. Resists on grained metal and zincated supports have been described, these supports having their surfaces thus prepared, when moistened with water, are repellent to the usual greasy printing inks. Cellulose ester supports subsequently surface-hydrolyzed can be used and other ink-repellent surfaces which may be provided with resist images according to our invention include plates or fibrous supports having a hydrophilic surface, for example, of water-permeable cellulose ether, polyvinyl alcohol, partially hydrolyzed polyvinyl esters, gum arabic, acrylic acid polymers and co-polymers, casein, and the like. The mentioned techniques for making aluminum plates can be employed for making an aluminum plate having aluminum foil as the metal support. In this instance, since handling of this foil is difficult, it is preferable to reinforce it, for example, by lamination with a paper backing, the surface away from the metal foil preferably carrying a water-resistant coating such as wax, cellulose ester or synthetic resin applied subsequent or prior to lamination.

We have found that when employing the light-sensitive materials of the invention for making printing plates, polyvinyl cinnamate is the most suitable of the polymeric materials since development of exposed layers of this resin give cleaner differentiation between the exposed and unexposed regions of a plate and it has superior adhesion to supports. Under certain conditions, cellulose cinnamate and the cinnamoylated resins may be desired, but polyvinyl cinnamate is more generally useful. In all cases, the synthetic polymeric materials give cleaner resist images under much less critical conditions of development than have been obtainable by use of bichromated materials or previously described sensitive materials containing the cinnamal group, that is, there is no tendency for the cinnamate resist image to be dissolved away during development. A further advantage of our sensitive materials lies in the fact that solutions and coatings of the polymeric esters containing our sensitizers may be made considerably in advance of the time of actual usage and after storage are found to have been little affected by non-ideal conditions of temperature and humidity. Bichromated glue or albumin layers can be sensitized only slightly in advance of usage because of their poor keeping properties. Other advantages of our sensitive materials have been noted in the above examples. Accordingly, an advantage of the sensitizing agents of the present invention over the nitro-compound sensitizers of the copending Minsk et al. U. S. patent application Serial No. 148,684, filed March 9, 1950, now U. S. Patent 2,610,120, granted September 9, 1952, lies in the fact that the compounds are, in general, better sensitizers and they are less explosive and allergenic.

We claim:

1. A photomechanical resist composition comprising a polymeric material selected from the group consisting of cinnamic acid esters of polyvinyl alcohol and cellulose as a combined carrier and light-sensitive material, and a compound selected from the group consisting of diaminobenzophenone imides, diaminodiphenyl methanes, diaminodiphenyl ketones, and diaminodiphenyl carbinols as a light-sensitizing agent for the composition.

2. A photomechanical resist composition comprising polyvinyl cinnamate as a combined carrier and light-sensitive material, and a diaminodiphenyl ketone compound as a light-sensitizing agent for the composition.

3. A photomechanical resist composition comprising polyvinyl cinnamate as a combined carrier and light-sensitive material, and a 4,4'-diaminodiphenyl ketone compound as a light-sensitizing agent for the composition.

4. A photomechanical resist composition comprising polyvinyl cinnamate as a combined carrier and light-sensitive material, and a 4,4'-tetralkyldiaminodiphenyl ketone compound as a light-sensitizing agent for the composition.

5. A photomechanical resist composition comprising polyvinyl cinnamate as a combined carrier and light-sensitive material, and a 4,4'-tetramethyldiaminodiphenyl ketone compound as a light-sensitizing agent for the composition.

6. A photomechanical resist composition comprising polyvinyl cinnamate as a combined carrier and light-sensitive material, and 4,4'-tetramethyldiaminodiphenyl ketone as a light-sensitizing agent for the composition.

7. A photomechanical resist composition comprising polyvinyl cinnamate as a combined carrier and light-sensitive material, and a diaminodiphenyl methane compound as a light-sensitizing agent for the composition.

8. A photomechanical resist composition comprising polyvinyl cinnamate as a combined carrier and light-sensitive material, and a 4,4'-tetralkyldiaminodiphenyl methane compound as a light-sensitizing agent for the composition.

9. A photomechanical resist composition comprising polyvinyl cinnamate as a combined carrier and light-sensitive material, and 4,4'-tetralkyldiaminodiphenyl methane as a light-sensitizing agent for the composition.

10. A photomechanical resist composition comprising polyvinyl cinnamate as a combined carrier and light-sensitive material, and a 4,4'-diaminodiphenyl carbinol compound as a light-sensitizing agent for the composition.

11. A photomechanical resist composition comprising polyvinyl cinnamate as a combined carrier and light-sensitive material, and a 4,4'-tetralkyldiaminodiphenyl carbinol compound as a light-sensitizing agent for the composition.

12. A photomechanical resist composition comprising polyvinyl cinnamate as a combined carrier and light-sensitive material, and 4,4'-tetramethyldiaminodiphenyl carbinol as a light-sensitizing agent for the composition.

13. A photomechanical resist composition comprising polyvinyl cinnamate as a combined carrier and light-sensitive material, and a benzophenone imide compound as a light-sensitizing agent for the composition.

14. A photomechanical resist composition comprising polyvinyl cinnamate as a combined carrier and light-sensitive material, and a 4,4'-diaminobenzophenone imide compound as a light-sensitizing agent for the composition.

15. A photomechanical resist composition comprising polyvinyl cinnamate as a combined carrier and light-sensitive material, and a 4,4'-tetralkyldiaminobenzophenone imide compound as a light-sensitizing agent for the composition.

16. A photomechanical resist composition comprising polyvinyl cinnamate as a combined carrier and light-sensitive material, and 4,4'-tetramethyldiaminobenzophenone imide as a light-sensitizing agent for the composition.

17. A photomechanical resist composition comprising polyvinyl cinnamate as a combined carrier and light-sensitive material, and 4,4'-tetraethyldiaminodiphenyl ketone as a light-sensitizing agent for the composition.

LOUIS M. MINSK.
WERTER P. VAN DEUSEN.
EARL M. ROBERTSON.

References Cited in the file of this patent

UNITED STATES PATENTS

| Number | Name | Date |
|---|---|---|
| 1,655,127 | Beebe | Jan. 3, 1928 |
| 1,880,808 | Clarke et al. | Oct. 4, 1932 |
| 2,118,864 | Reppe et al. | May 31, 1938 |
| 2,184,288 | Dangelmajer | Dec. 26, 1939 |
| 2,273,891 | Pollack et al. | Feb. 24, 1942 |
| 2,318,959 | Muskat et al. | May 11, 1943 |
| 2,332,900 | D'Alelio | Oct. 26, 1943 |

FOREIGN PATENTS

| Number | Country | Date |
|---|---|---|
| 618,181 | Great Britain | Feb. 17, 1949 |

OTHER REFERENCES

Plastics, February 1948, page 82.